United States Patent [19]
Hattori

[11] Patent Number: 6,005,295
[45] Date of Patent: Dec. 21, 1999

[54] SEMICONDUCTOR DEVICE AND MANUFACTURING METHOD THEREFOR

[75] Inventor: Sachiko Hattori, Hyogo, Japan

[73] Assignee: Mitsubishi Denki Kabushiki Kaisha, Tokyo, Japan

[21] Appl. No.: 08/988,210

[22] Filed: Dec. 10, 1997

[30] Foreign Application Priority Data

Jun. 4, 1997 [JP] Japan ................................. 9-146394

[51] Int. Cl.⁶ ............................................. H01L 23/544
[52] U.S. Cl. ........................... 257/797; 257/750; 257/765
[58] Field of Search .................................. 257/797, 765, 257/762, 763, 764, 750, 771

[56] References Cited

U.S. PATENT DOCUMENTS

| | | |
|---|---|---|
| 5,401,691 | 3/1995 | Caldwell . |
| 5,475,268 | 12/1995 | Kawagoe et al. ................. 257/797 |
| 5,503,962 | 4/1996 | Caldwell . |
| 5,760,483 | 6/1998 | Bruce et al. ........................ 257/797 |
| 5,760,484 | 6/1998 | Lee et al. .......................... 257/797 |
| 5,783,490 | 7/1998 | Tseng .............................. 257/797 |

*Primary Examiner*—Valencia Martin-Wallace
*Assistant Examiner*—S. V. Clark
*Attorney, Agent, or Firm*—McDermott, Will & Emery

[57] ABSTRACT

The object of the present invention is to provide a method of manufacturing an improved semiconductor device in which overlay-accuracy can be enhanced even when a halftone mask is used. An oxide film is formed on an antireflection film. Resist films are selectively irradiated with light using a halftone phase shift mask.

Subsequently, it is developed to form resist patterns for a connecting hole and an overlay mark. According to the present invention, the provision of an antireflection film under an oxide film prevents formation of a ghost pattern in an overlay mark portion.

5 Claims, 13 Drawing Sheets

FIG.12
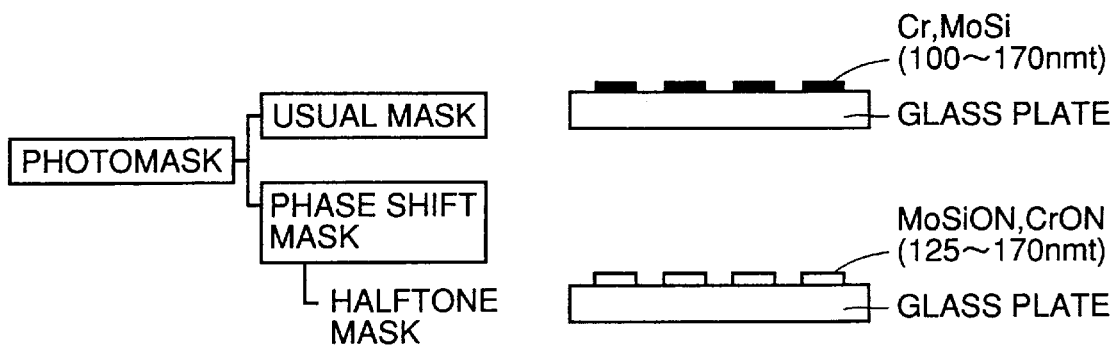
FIG.13A  FIG.13B
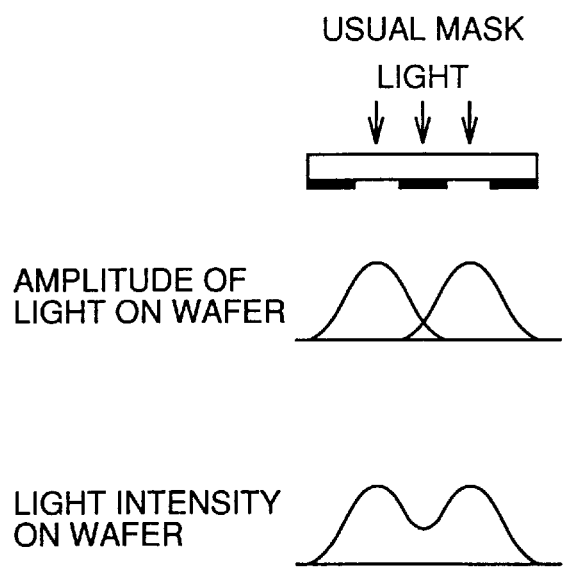
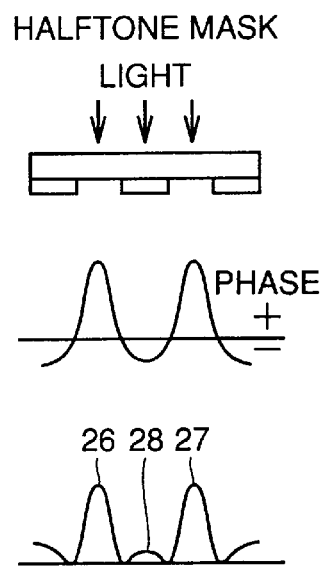

SEMICONDUCTOR DEVICE AND MANUFACTURING METHOD THEREFOR

BACKGROUND OF THE INVENTION

1. Field of the Invention

The present invention relates to semiconductor devices, and more specifically, to a semiconductor device having a connecting hole not larger than 0.4 μm☐ in size and an overlay mark. The present invention also relates to a method of manufacturing such a semiconductor device.

2. Description of the Background Art

In the manufacture of a semiconductor device, the higher integration and accompanying scaling down of the semiconductor device are making the width of a pattern line as well as the space between pattern lines smaller. In addition, strict overlay-accuracy for high density integration is required due to complication of the longitudinal structure of a device.

FIG. 11 is an illustration showing a conventional overlay technique. Overlapping is accomplished when a pattern on a photomask 20 is transferred to a wafer 21. More specifically, in the overlaying, the position of a wafer overlay mark 23 in diffraction grating form formed on the wafer is measured using alignment light 24 through photomask 20. The displacement between the position thus measured and a stage is corrected by moving the stage, and a chip pattern 25 on photomask 20 is transferred onto wafer 21 as a chip pattern 26a. It is noted that the wafer alignment pattern to be used for overlapping the next layer is also transferred at the same time.

There are at least two types of such overlay marks 22, one for the alignment in the X direction and the other in the Y direction.

For the high density integration and accompanying scaling down of a semiconductor device, a technique for forming a fine pattern using a halftone phase shift mask (hereinafter referred to as a halftone mask) as photomask 20 has been proposed.

With reference to FIG. 12, photomasks in general includes a usual mask and a phase shift mask. A halftone mask is known as an example of the phase shift mask. The usual mask is a glass plate on which a pattern formed of metal such as Cr or MoSi is formed. The halftone mask is a glass plate on which a metal pattern of MoSiON, CrON or the like is formed.

The halftone mask is provided with a material which inverts the phase of light passing through non-shading portions in the location corresponding to shading portions formed on the usual mask. The halftone mask enhances the light contrast of the pattern and forms a fine pattern as compared with the usual mask.

FIGS. 13A and 13B show the differences between the usual mask and the halftone mask. As for the halftone mask, the phase of light is inverted in the non-shading portion. The use of the halftone mask allows a pattern 26 and a peak 27 of light intensity to be clearly distinguished, thereby increasing resolution. A peak 28 of light intensity is however formed that can cause a ghost pattern as will be later described.

The problem associated with the manufacture of a semiconductor device by means of lithography technique using a conventional halftone mask will now be described.

With reference to FIG. 14, a connecting hole portion 29 and an overlay mark portion 30 are formed on a semiconductor substrate 9. A first oxide film 10, a barrier metal 11, an aluminum film 12, a titanium nitride film 13 and a second oxide film 14 are formed on semiconductor substrate 9 in connecting hole portion 29. First and second oxide films 10 and 14 are formed on semiconductor substrate 9 in overlay mark portion 30. Resist 15 for forming a connecting hole is provided in connecting hole portion 29. Resist 15b for forming an overlay mark is provided in overlay mark portion 30. A halftone mask 31 having non-shading portions in the positions to have a connecting hole and an overlay mark, respectively, is prepared. Halftone mask 31 has shading and non-shading portions 32 and 33 in overlay mark portion 30. Resist 15 is irradiated with light 34 using halftone mask 31. At this time, portions 35 and 36 to have a connecting hole and an overlay mark, respectively, are also exposed to the light. Further, a ghost pattern 37 is produced in the non-shading portion at the time. Ghost pattern 37 is formed by the phase-inverted light (corresponding to peak 28 in the light intensity) reflected by the surface of substrate 9 and directed upon resist 15b.

The formation of ghost pattern 37 will now be described in further detail. FIG. 22 shows changes in the reflectivity of the surface of an oxide film relative to changes in thickness when the oxide film is provided on a highly reflective substrate such as a silicon substrate. As is apparent from FIG. 22, the amplitude of the reflectivity caused by the change in the thickness of the oxide film is large. The change in the diameter of the opening portion of resist is accordingly large as shown in FIG. 23. The amplitude period of reflectivity corresponds to about 1240 Å for a wavelength of 365 nm, and therefore the maximum and minimum values of reflectivity are within the range of the amplitude if the thickness of the oxide film changes by 620 Å. Thus, the diameter of the opening portion of the resist largely changes. When an oxide film having a thickness around 10000 Å is provided, the resist is inevitably exposed to light reflected from the silicon substrate due to the above mentioned change in the diameter if the thickness of the oxide film has a variation of 10% in its surface.

FIG. 24 is a graph showing the optimum exposure amount relative to the size of a connecting hole to be formed on the highly reflective substrate. The exposure amount allowing formation of a ghost pattern is also shown in FIG. 24. Herein, the abscissa represents the size of the connecting hole, and the optimum exposure amount given in FIG. 24 also applies to an overlay mark having a diameter of at least 1 μm, which can be regarded as the same in terms of size to the connecting hole having a diameter of 1 μm.

Assuming that the optimum exposure amount in the case of a connecting hole of 1 μm☐ is normalized as 1, 1.5 times of the optimum exposure amount is required for a connecting hole of 0.4 μm☐. Then, the optimum exposure amount allowing formation of a ghost pattern is sufficiently between the normalized 1.5 and 1. With reference to FIG. 14, ghost pattern 37 is consequently formed in the overlay mark portion in forming connecting hole 35.

It is noted that the overlay mark can be well or poorly formed because of the variation in reflectivity as is apparent from FIGS. 22 and 23. This variation is the problem.

Returning to FIGS. 14, 15 and 16, development of resist 15 to form resist patterns 15a and 15b actually results in resist patterns 15a and 15b having an undesired void portion 38 caused by the light for forming a ghost pattern peculiar to a halftone mask as shown in FIG. 16 rather than those free from a void in a resist as shown in FIG. 15.

It is noted that the overlay mark is in a striped pattern having a width of 1 μm and the size of the connecting hole is 0.4 μm☐.

With reference to FIGS. 16 and 17, etching oxide film 14 using resist patterns 15a and 15b as masks forms oxide films 16a and 16b having a connecting hole 39 and a pattern 40 of an oxide film to be an overlay mark, respectively. A poorly shaped resist pattern causes a void 141 to be formed in pattern 40 of the oxide film, that is, in the overlay mark.

With reference to FIG. 18, a second interconnection layer 41 is formed to contact with a titanium nitride film 13 though connecting hole 39. At the time, the component of the second interconnection layer is formed also in overlay mark portion 30. Resist 42 is applied to cover second interconnection 41.

Then, resist 42 is selectively exposed to light through a halftone mask using an overlay mark 40 as a reference for alignment to form a resist pattern 43. Although resist pattern 43 is a portion for patterning second interconnection layer 41, it is formed offset due to the poorly shaped overlay mark 40 as shown in FIG. 18.

With reference to FIGS. 18 and 19, resist 42 is developed to form resist pattern 43.

With reference to FIGS. 19 and 20, patterning of second interconnection layer 41 using resist pattern 43 as a mask forms second interconnection layer 41 disconnected from aluminum film 12, the first interconnection layer. It is noted that FIG. 21 is a cross section of a semiconductor device where the steps have ideally proceeded without having the above mentioned offset. In this case, second interconnection layer 41 is tightly connected to aluminum film 12 having titanium nitride film 13 interposed.

The above mentioned disconnection causes yield to decrease in the manufacture of a semiconductor device.

SUMMARY OF THE INVENTION

The present invention is intended to solve the above problem and it is an object to provide a method of manufacturing an improved semiconductor device to enhance overlay accuracy using a halftone mask.

It is another object of the present invention to provide a semiconductor device manufactured by such a method.

In a semiconductor device according to a first aspect of the invention, a first interconnection layer and a second interconnection layer provided thereabove are connected to each other through a connecting hole. The device is provided with a semiconductor substrate. A connecting hole portion having the connecting hole and an overlay mark portion having an overlay mark are provided on the semiconductor substrate. The overlay mark portion includes a pattern of oxide film to be an overlay mark and an antireflection film underlying the pattern of the oxide film.

In the semiconductor device according to a second aspect of the invention, the antireflection film is provided on a metal film formed on the semiconductor substrate.

In the semiconductor device according to a third aspect of the invention, the metal film is formed of a material mainly including aluminum, aluminum silicon, aluminum copper, copper or tungsten.

In the semiconductor device according to a fourth aspect of the invention, the antireflection film is formed of titanium, titanium nitride, amorphous silicon or silicon nitride.

In the semiconductor device according to a fifth aspect of the invention, the size of the connecting hole is not larger than 0.4 $\mu m\square$.

In a method of manufacturing a semiconductor device according to a sixth aspect of the invention, a first interconnection layer and a second interconnection layer provided thereabove are connected through a connecting hole. A metal film for the first interconnection layer is formed on a semiconductor substrate. A conductive antireflection film is formed on the first metal film. An oxide film is formed on the antireflection film. A resist layer is formed on the oxide film. The resist layer is selectively irradiated with light using a halftone phase shift mask. Then, it is developed to form resist patterns for forming the connecting hole and an overlay mark. The oxide film is etched using the resist patterns for the connecting hole and the overlay mark as masks to form the connecting hole in the oxide film as well as a pattern of oxide film for the overlay mark. The second interconnection layer is formed to be electrically connected to the first interconnection layer through the connecting hole using the overlay mark as a reference for alignment by means of lithography technique.

In the method of manufacturing a semiconductor device according to a seventh aspect of the invention, the metal film is formed of a material mainly including aluminum, aluminum silicon, aluminum copper, copper or tungsten.

In the method of manufacturing a semiconductor device according to an eighth aspect of the invention, the antireflection film is formed of titanium, titanium nitride, amorphous silicon or silicon nitride.

In the method of manufacturing a semiconductor device according to a ninth aspect of the invention, the size of the connecting hole is not larger than 0.4 $\mu m\square$.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a diagram showing the types of conventional photo masks.

FIGS. 13A and 13B are diagrams showing the functions of conventional usual and halftone type masks.

DESCRIPTION OF THE PREFERRED EMBODIMENTS

A method of manufacturing a semiconductor device according to the present invention will now be described with reference to the drawings.

Figure 1:
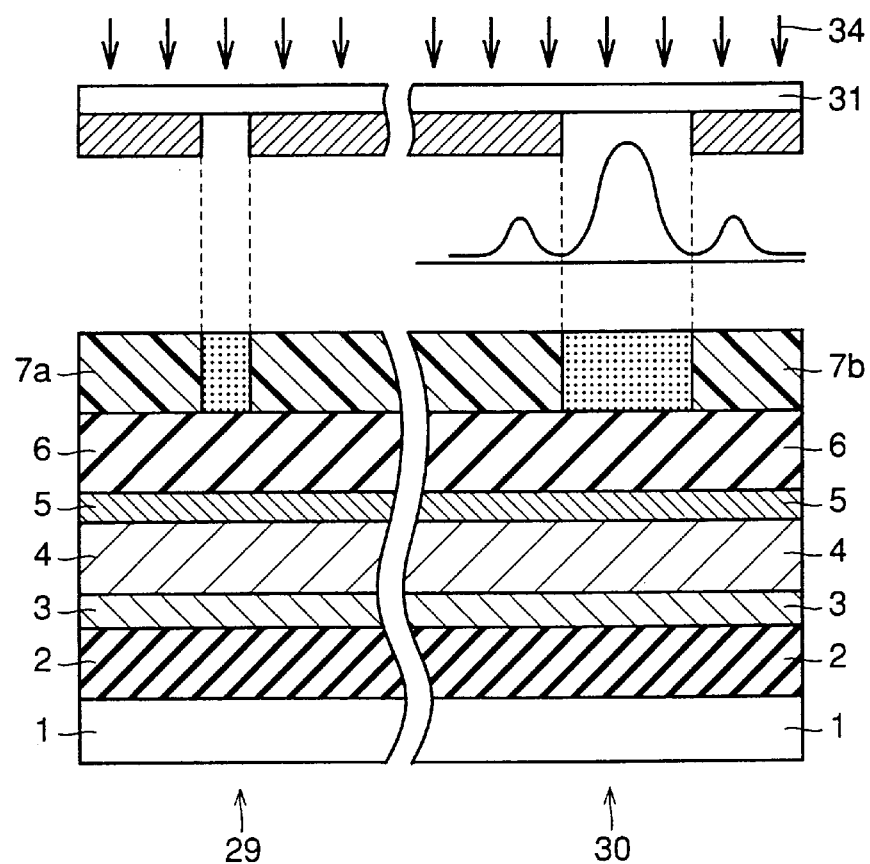
FIG. 1 is a cross sectional view showing a semiconductor device in the first step of a method of manufacturing a semiconductor device according to an embodiment of the present invention.

With reference to FIG. 1, a semiconductor substrate 1 having a connecting hole portion 29 and an overlay mark portion 30 is prepared. Connecting hole portion 29 and overlay mark portion 30 both include a substrate 1, a first oxide film 2, a barrier metal 3, an aluminum film 4, a titanium nitride film 5 and a second oxide film 6. Resist films 7a and 7b are provided on second oxide film 6. A halftone mask 31 having non-shading portions at the positions to have a connecting hole and an overlay mark, respectively, is prepared. Resist films 7a and 7b are irradiated by light 34 using halftone mask 31.

Figure 2:
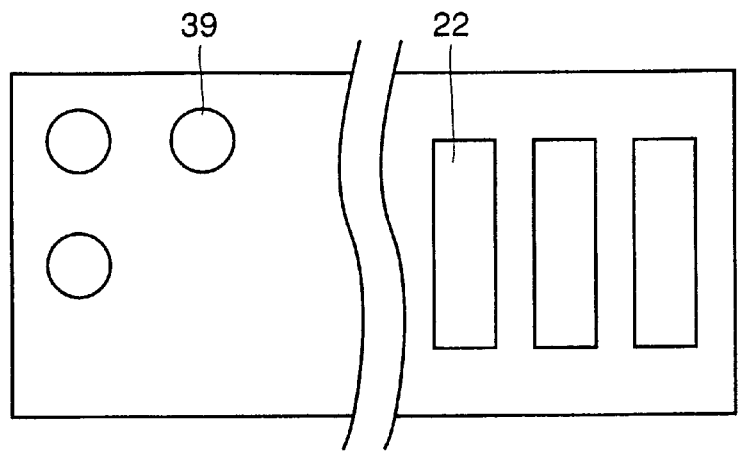
FIG. 2 is a plan view of the semiconductor device shown in FIG. 1.

FIG. 2 is a plan view of the semiconductor device shown in FIG. 1. With reference to FIG. 2, the size of connecting hole 39 is 0.4 $\mu$m□. The present invention is effective in forming a connecting hole not larger than this size. An overlay mark 22 is a striped pattern having a width of 1 $\mu$m.

Titanium nitride film 5 is not only essential to maintaining the reliability of aluminum interconnection 4 but also serves as an antireflection film for aluminum film 4.

Figure 3:
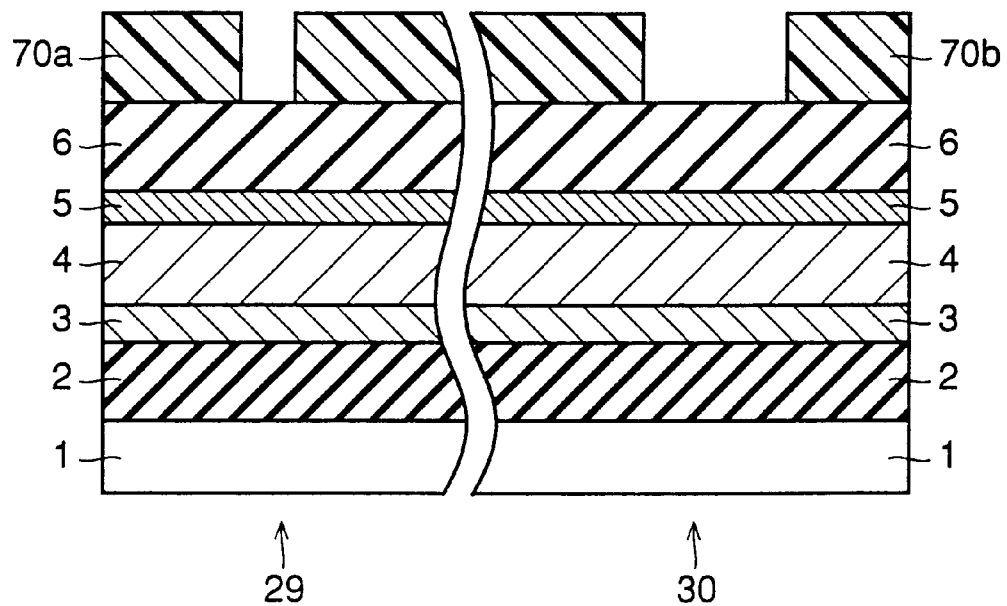
FIGS. 3 to 7 are cross sectional views of the semiconductor device in the second to sixth steps of the method of manufacturing a semiconductor device according to the embodiment of the present invention.

With reference to FIGS. 1 and 3, resist films 7a and 7b are developed. As titanium nitride film 5 serves as an antireflection film for aluminum film 4 in the overlay mark portion, the resulting resist pattern 70b forming an overlay mark is free from a ghost pattern and a suitable shape is attained.

Figure 4:
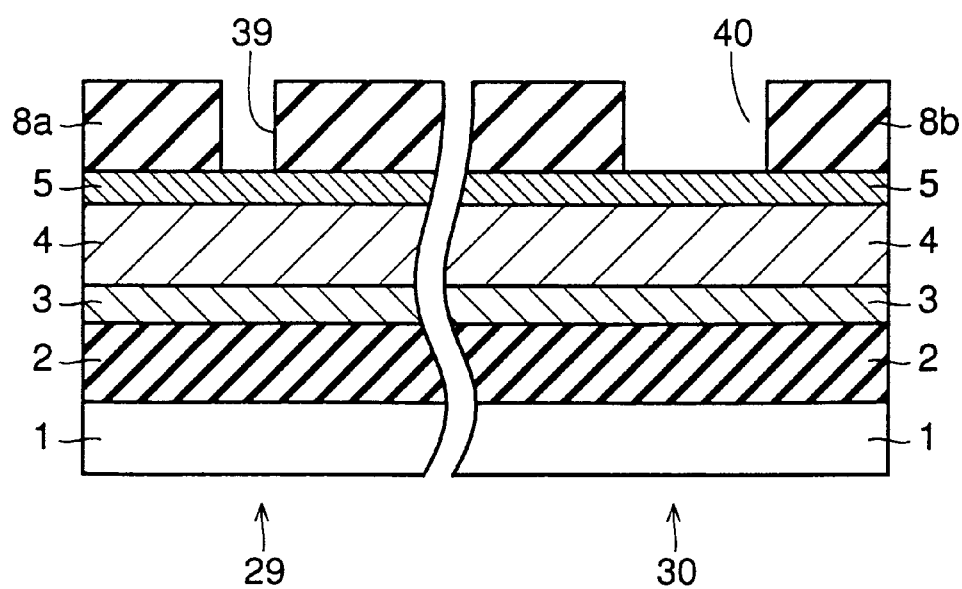

With reference to FIGS. 3 and 4, a second oxide film 6 is etched using resist patterns 70a and 70b as masks to form an oxide film 8a having connecting hole 39 as well as a pattern 8b formed of an oxide film to have an overlay mark 40.

Figure 5:
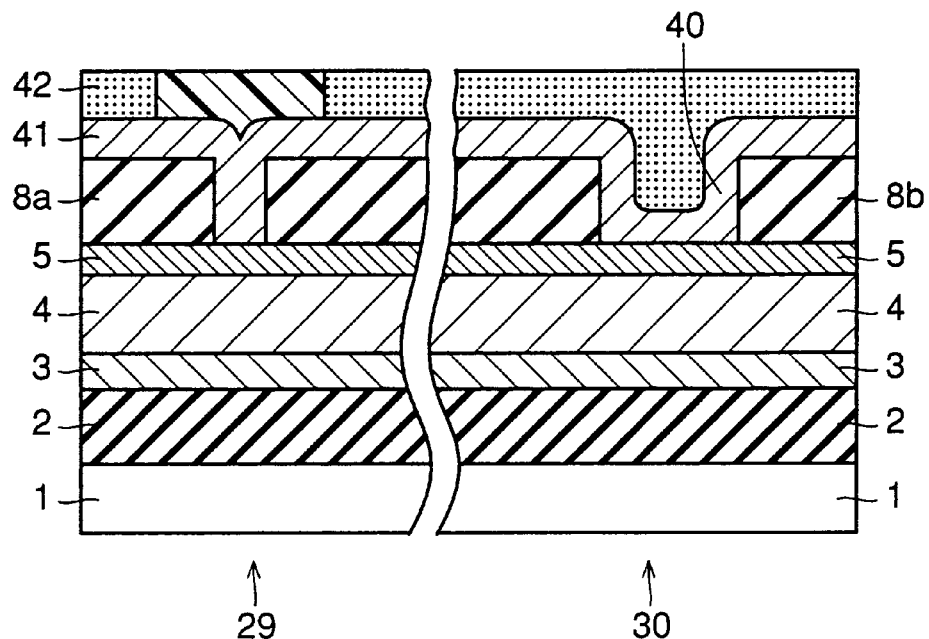

With reference to FIGS. 4 and 5, a second interconnection layer 41 is formed on semiconductor substrate 1 to contact with titanium nitride film 5 through connecting hole 39. A resist film 42 is formed on second interconnection layer 41. Resist film 42 is selectively exposed to light using overlay mark 40 as a reference for alignment.

Figure 6:
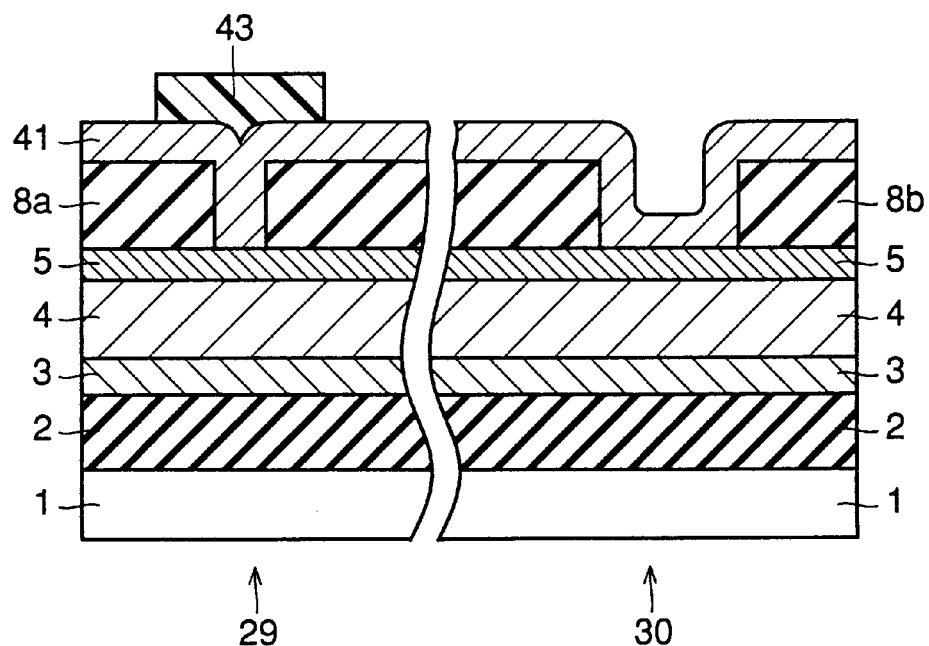

With reference to FIGS. 5 and 6, resist film 42 is developed to form a resist pattern 43.

Figure 7:
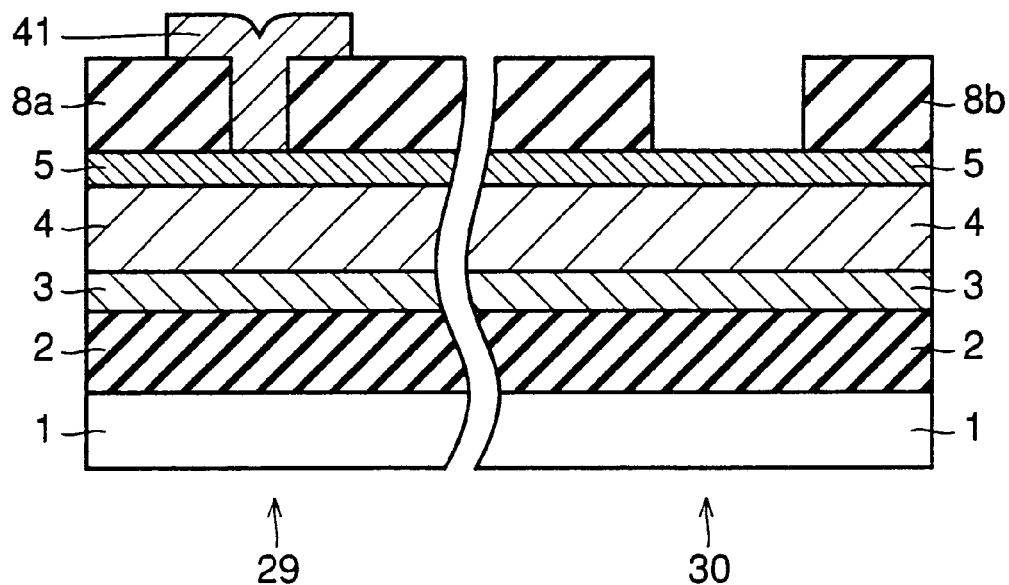

With reference to FIGS. 6 and 7, second interconnection layer 41 is etched using resist pattern 43 as a mask to form a pattern for second interconnection layer 41. The suitable shape of overlay mark 40 allows formation of the pattern for second interconnection layer 41 in a prescribed position without being offset.

Next, the reason why the overlay mark can be suitably formed will be described.

Figure 8:
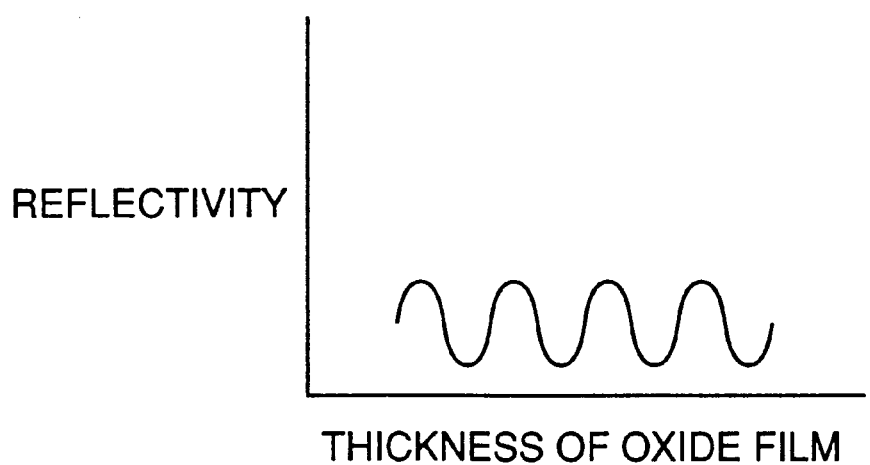
FIG. 8 is a diagram showing a relation between the thickness of an oxide film and reflectivity when a low reflective substrate is used.
Figure 9:
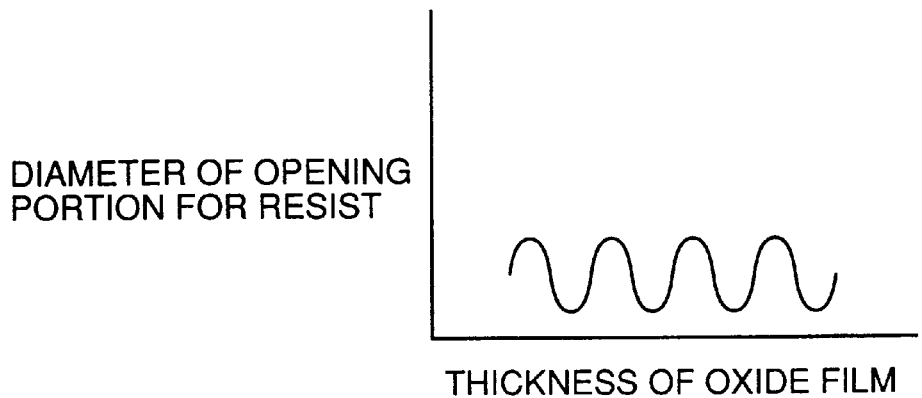
FIG. 9 is a diagram showing a relation between the thickness f an oxide film and the diameter of the opening portion in a resist when a low reflective substrate is used.

FIG. 8 is a diagram showing a relation between the thickness of an oxide film and the reflectivity in the surface of the oxide film when the oxide film is formed on a low reflective substrate. As shown, the amplitude of reflectivity resulting from the change in thickness of the oxide film becomes smaller on the low reflective substrate. Accordingly, with reference to FIG. 9, the variation of the diameter of an opening portion for the resist also becomes smaller. FIG. 9 shows that even if there is a variation in the thickness of the oxide film, the change in the diameter of the opening portion in the resist can be restrained is not large when the change in the reflectivity is small.

Figure 10:
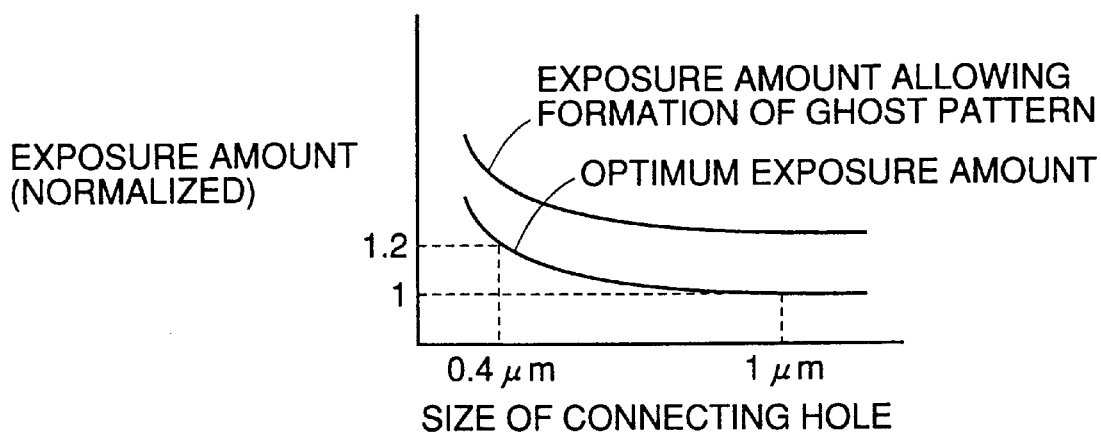
FIG. 10 is a diagram showing a relation between the size of connecting hole and the optimum exposure amount when a low reflective substrate is used.
Figure 11:
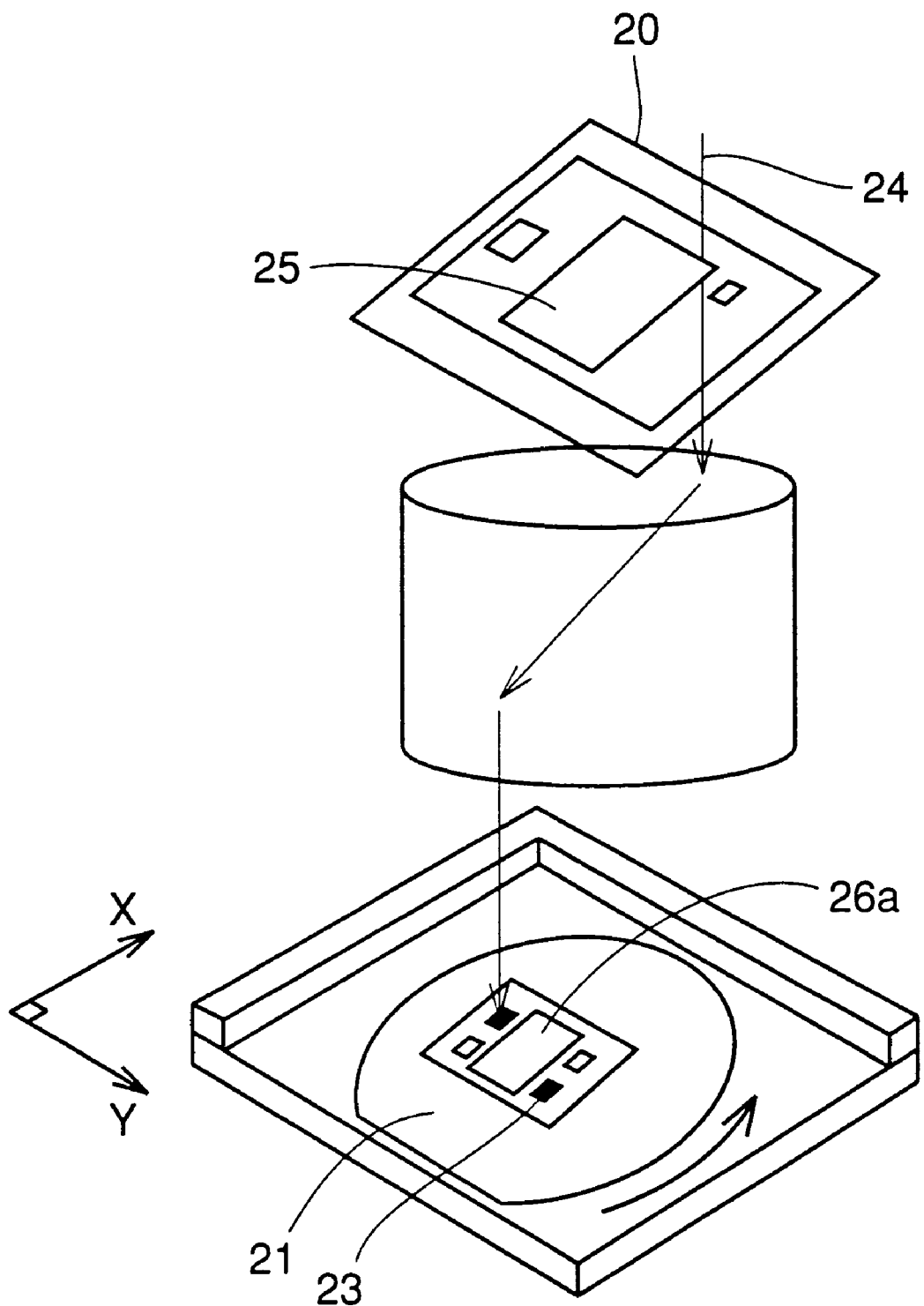
FIG. 11 is a view showing a conventional overlay technique.
Figure 14:
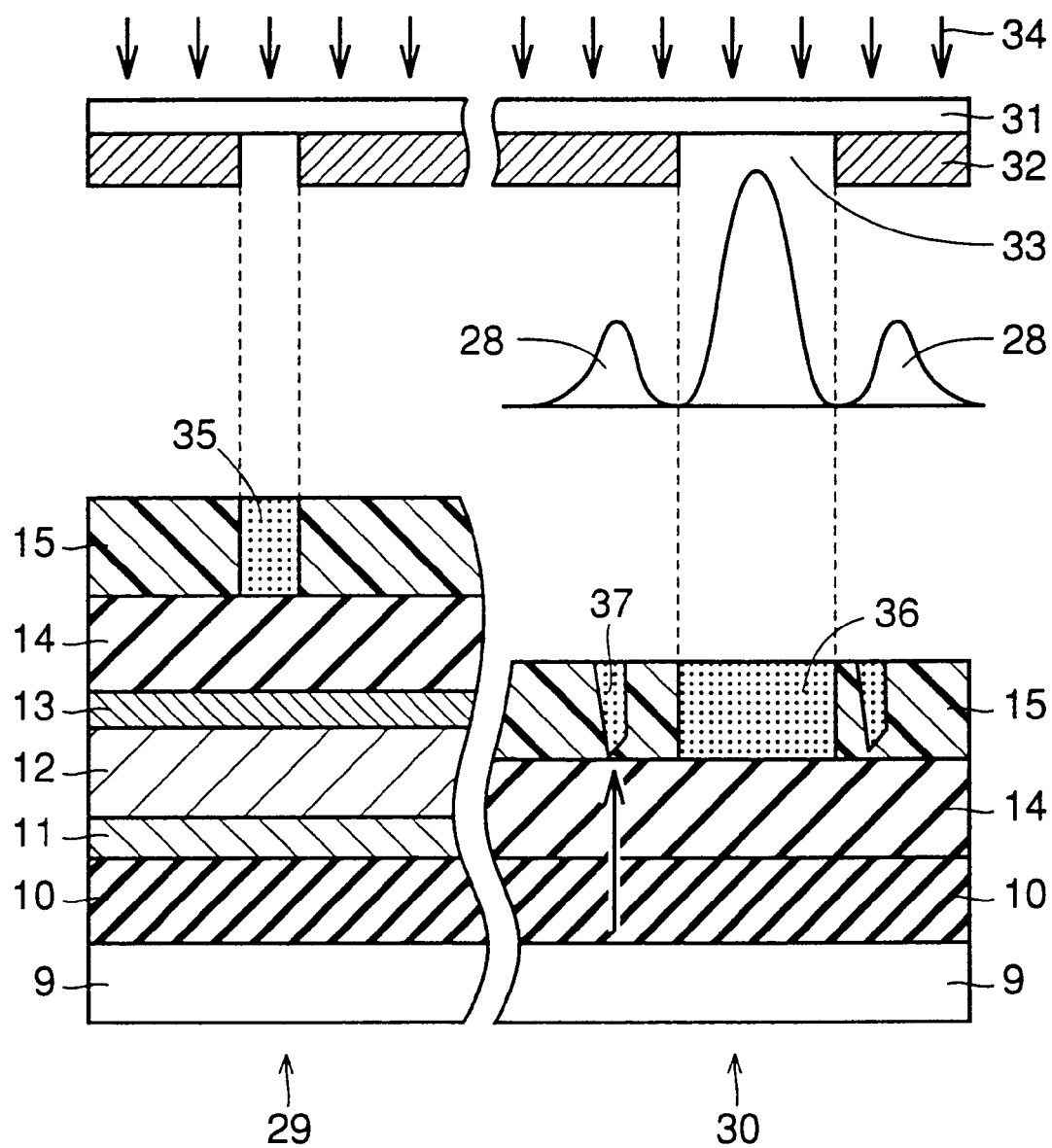
FIGS. 14 to 20 are sectional views of the semiconductor device first to seventh steps of a conventional method of manufacturing a semiconductor device.
Figure 15:
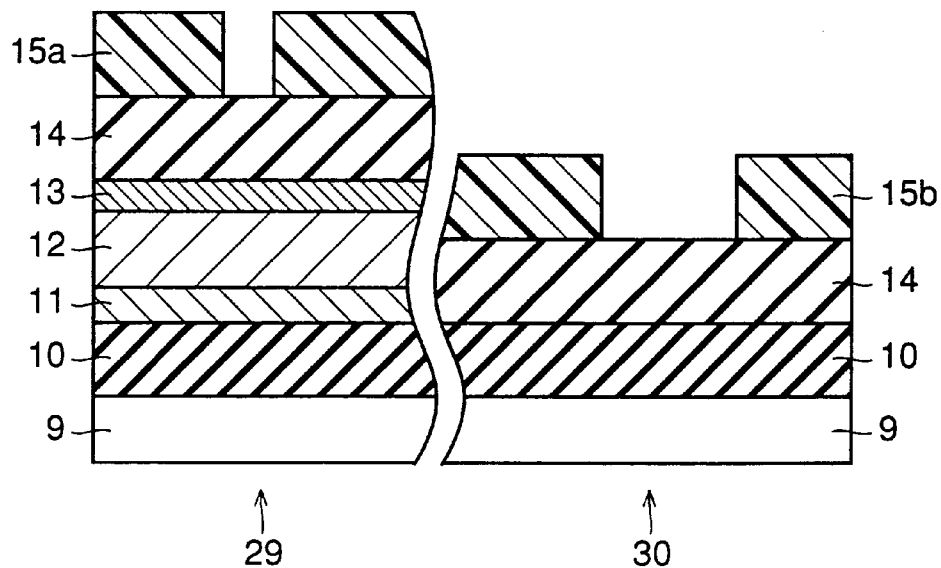
Figure 16:
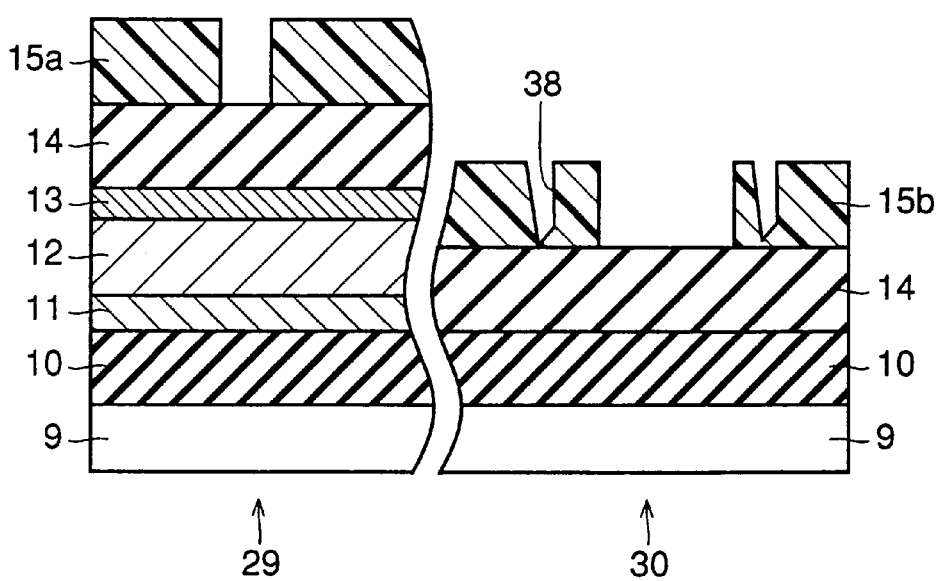
Figure 17:
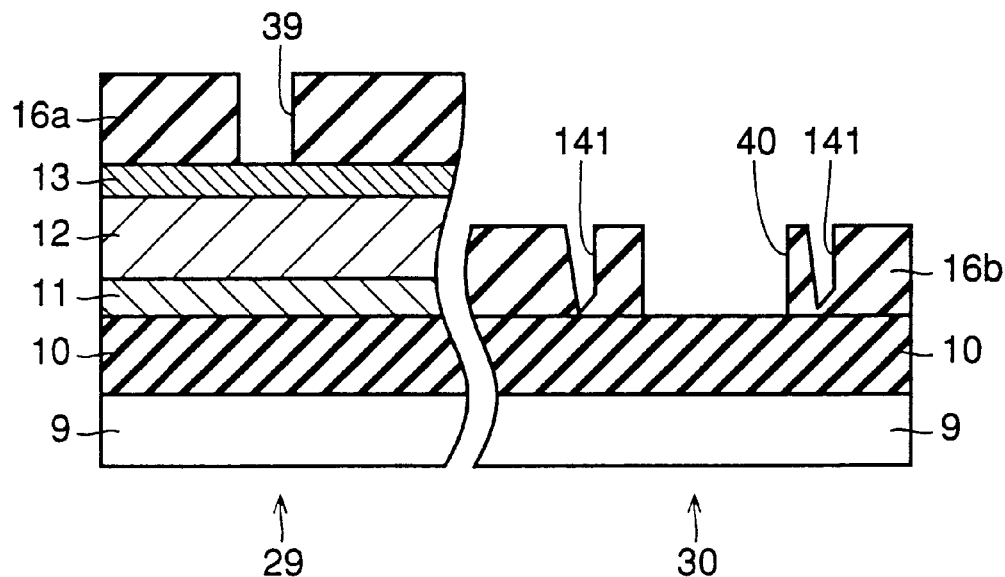
Figure 18:
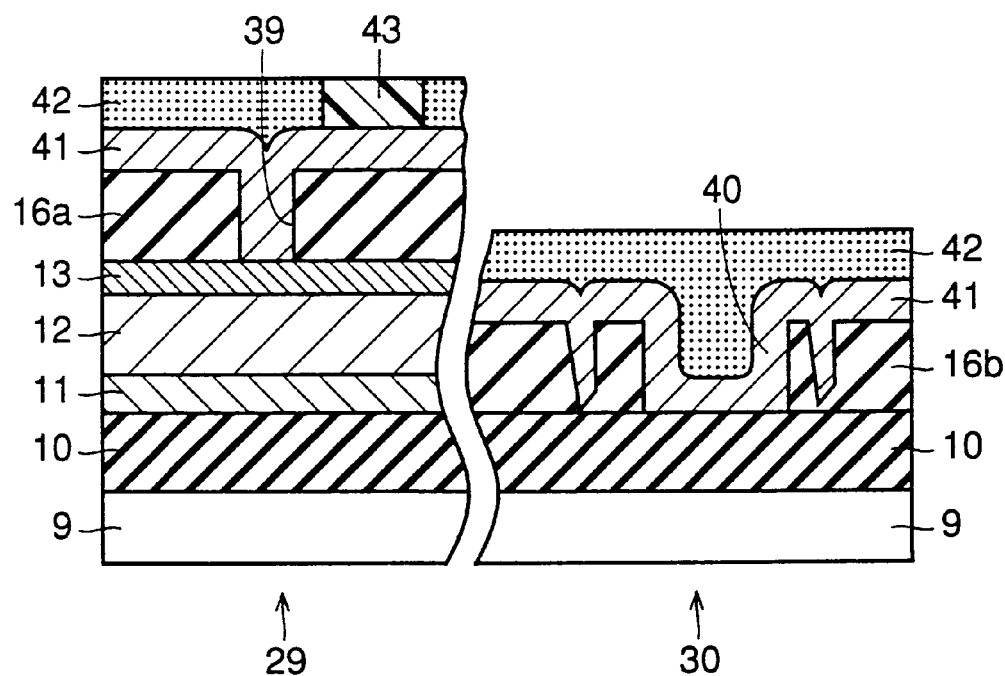
Figure 19:
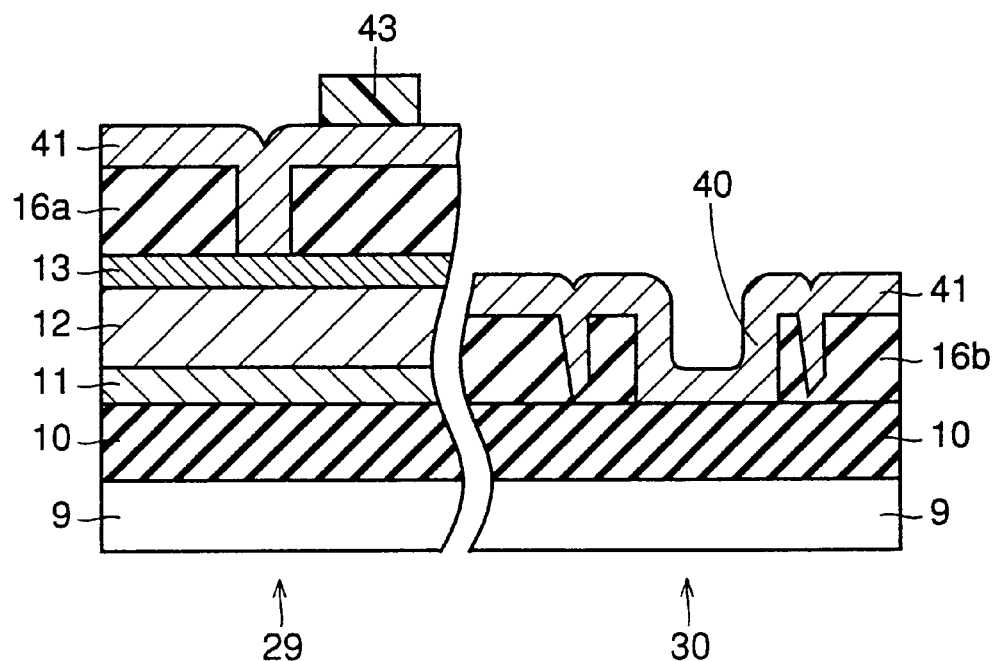
Figure 20:
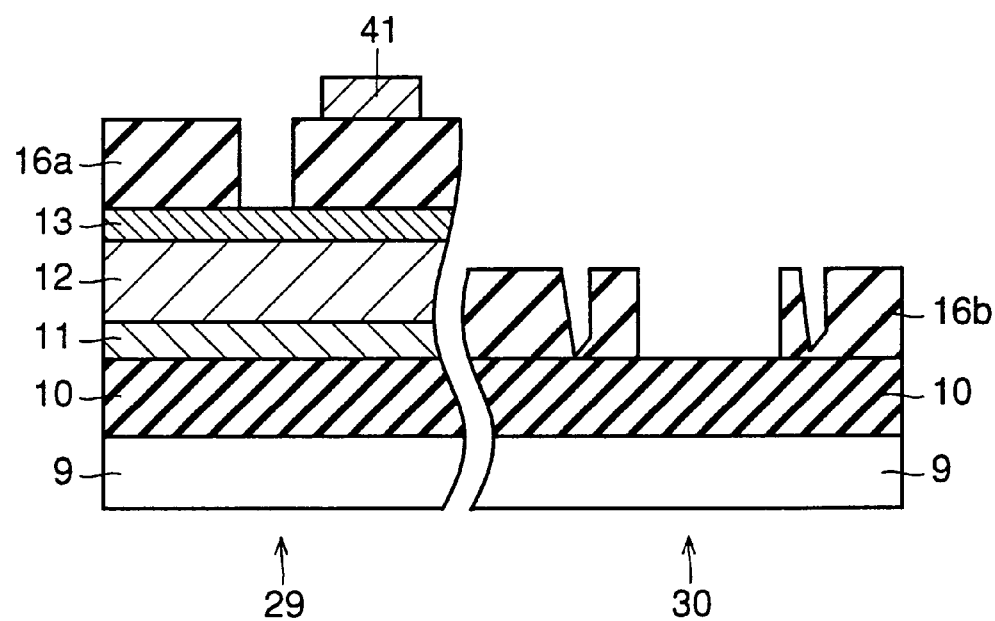
Figure 21:
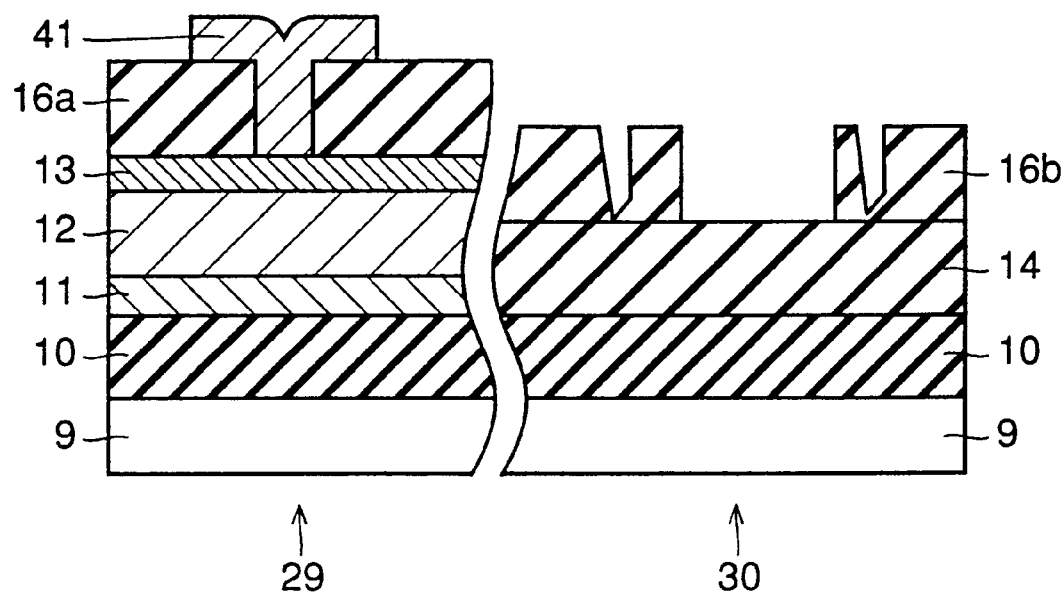
FIG. 21 is a cross sectional view of an imaginary semiconductor device if the steps can proceed ideally in the conventional method of manufacturing a semiconductor device.
Figure 22:
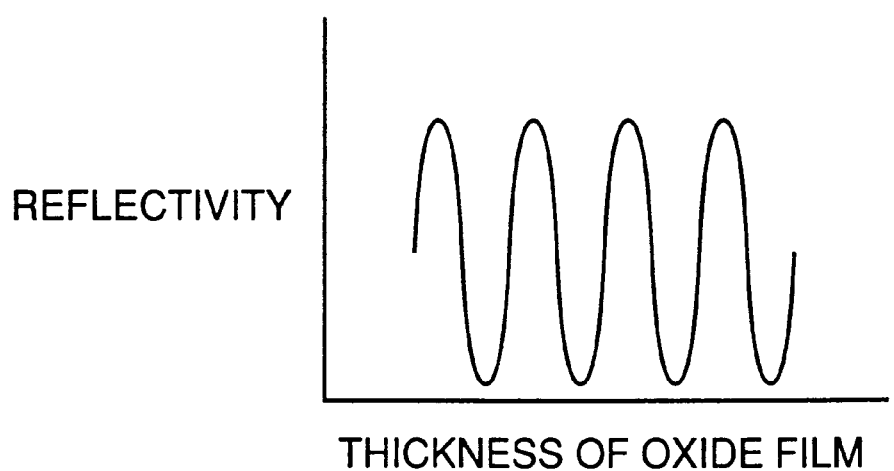
FIG. 22 is a diagram showing a relation between the thickness of an oxide film and reflectivity when a highly reflective substrate is used.
Figure 23:
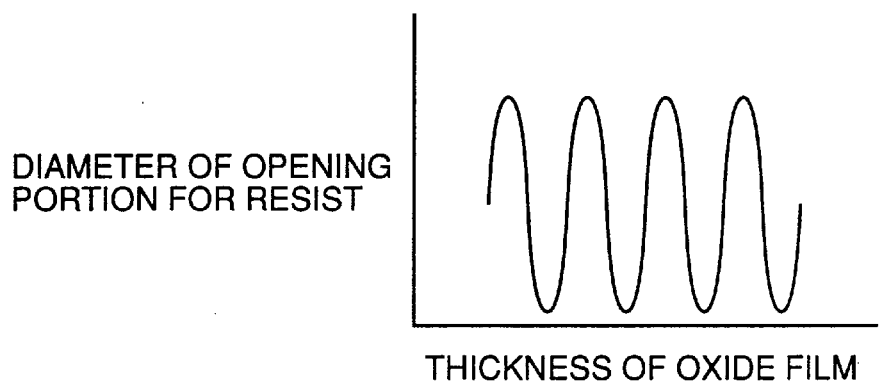
FIG. 23 is a diagram showing a relation between the thickness an oxide film and the diameter of the opening portion of a resist when a highly reflective substrate is used.
Figure 24:
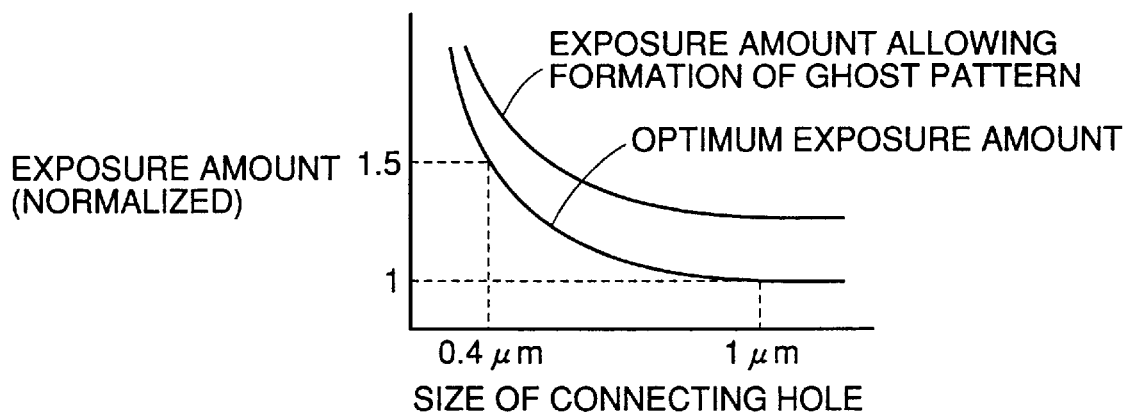
FIG. 24 is a diagram showing a relation between the size of a connecting hole and the optimum exposure amount when a highly reflective substrate is used.

FIG. 10 shows a relation between the size of a connecting hole and the optimum exposure amount on the low reflective substrate. The exposure amount allowing formation of a ghost pattern is also shown in this figure. Assuming that the optimum exposure amount for forming a connecting hole having a diameter of 1 $\mu$m is normalized as 1, the optimum exposure amount for forming a connecting hole having a diameter 0.4 $\mu$m is 1.2. As is shown in FIG. 10, the optimum exposure amount allowing formation of a ghost pattern is above the (normalized) optimum exposure amount, 1.2. Thus, a ghost pattern is not formed with the optimum exposure amount for forming a connecting hole having a diameter of 0.4 $\mu$m.

It is noted that the titanium nitride film underlying the overlay mark functions as an antireflection film for the aluminum film in the present embodiment. As a result, according to the principles described in conjunction with FIGS. 8 to 10, a ghost pattern is not formed in the overlay mark portion in forming a connecting hole, and therefore a suitable resist pattern can be obtained.

While the aluminum film is used as a metal film in the above embodiment, the present invention is not limited to this and other films, for example of aluminum silicon, aluminum copper, copper or tungsten can be used.

In addition, while the titanium nitride film is used as an example of an antireflection film, the present invention is not limited to this and any of titanium film, amorphous silicon and silicon nitride films may be used.

Further, although a combination of the aluminum film and titanium nitride films as a structure of an interconnection film is used in the above embodiment, the present invention is not limited to this and any film which serves as an antireflection film under an oxide film can be used. A film capable of absorbing light or buffering light may be used as an antireflection film. The titanium and titanium nitride films can prevent reflection by absorbing light, whereas the amorphous silicon and nitride silicon films can prevent reflection by means of buffering light.

In addition, although alignment light passes through a photo mask in the above embodiment, the present invention is not limited to this and anything can be used as long as it can determine the position of the overlay mark on a wafer even when alignment light does not pass through a photo mask or a lens.

In a semiconductor device according to a first aspect of the invention, the overlay portion includes a pattern of an oxide film for the overlay mark and an antireflection film underlying the pattern of the oxide film, and therefore a ghost pattern is not formed in the overlay portion. As a result, a semiconductor device not having disconnection in the connecting hole portion can be obtained.

In the semiconductor device according to a second aspect of the invention, the antireflection film is provided on a metal film formed on a semiconductor substrate. As a result, reflection of light by the metal film can be prevented, thereby avoiding formation of a ghost pattern. Consequently, a semiconductor device without disconnection in a connecting hole portion can be obtained.

In the semiconductor device according to a third aspect of the invention, as the metal film is formed of aluminum, aluminum silicon, aluminum copper, copper or tungsten, a semiconductor device including an interconnection with high conductivity can be obtained.

In the semiconductor device according to a fourth aspect of the invention, since the antireflection film is formed of titanium or titanium nitride, the light causing a ghost pattern can effectively be absorbed. Further, reflection can be effectively prevented by buffering of light when aluminum silicon and nitride silicon are used as an antireflection film.

In the semiconductor device according to the a fifth aspect of the invention, as the size of a connecting hole is not larger than 0.4 $\mu$m☐, it is effectively adaptable to high density integration of semiconductor devices.

In a method of manufacturing a semiconductor device according to a sixth aspect of the invention, since an antireflection film is formed under the oxide film located under a resist layer, a ghost pattern is not formed in the resist layer even when the resist layer is selectively irradiated by light using a halftone mask.

In the method of manufacturing a semiconductor device according to a seventh aspect of the invention, aluminum, aluminum silicon, aluminum copper, copper or tungsten is used for a metal film, and therefore a semiconductor device having an interconnection with high conductivity can effectively be obtained.

In the method of manufacturing a semiconductor device according to an eighth aspect of the invention, titanium, titanium nitride, amorphous silicon or silicon nitride is used for an antireflection film, and therefore formation of a ghost pattern can effectively be prevented.

In the method of manufacturing a semiconductor device according to a ninth aspect of the invention, as the size of the connecting hole is not larger than 0.4 $\mu$m☐, a semiconductor device having a fine pattern can effectively be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having a first interconnection layer and a second interconnection layer provided over said first interconnection layer and connected through a connecting hole, comprising:

a semiconductor substrate; and a connecting hole portion to have said connecting hole and an overlay mark portion to have an overlay mark provided on said semiconductor substrate;

said overlay portion including a pattern of an oxide film to be an overlay mark and an antireflection film underlying the pattern of said oxide film.

2. The semiconductor device according to claim 1, wherein a metal film is provided on said semiconductor substrate and said antireflection film is provided on said metal film.

3. The semiconductor device according to claim 2, wherein said metal film is formed of a material mainly including aluminum, aluminum silicon, aluminum copper, copper or tungsten.

4. The semiconductor device according to claim 1, wherein said antireflection film includes titanium, titanium nitride, amorphous silicon or silicon nitride.

5. The semiconductor device according to claim 1, wherein the size of said connecting hole is not larger than 0.4 $\mu$m☐.

* * * * *